United States Patent
Warehime

(10) Patent No.: US 6,846,983 B1
(45) Date of Patent: Jan. 25, 2005

(54) MILLIVOLTAGE GENERATOR

(76) Inventor: Lester L. Warehime, 1520 E. 19th St., Tulsa, OK (US) 74120

(*) Notice: Subject to any disclaimer, the term of this patent is extended or adjusted under 35 U.S.C. 154(b) by 1013 days.

(21) Appl. No.: 08/931,253

(22) Filed: Sep. 16, 1997

(51) Int. Cl.$^7$ .......................... H01L 35/04; H01L 35/08
(52) U.S. Cl. ...................... 136/230; 136/228; 136/205
(58) Field of Search ............................... 136/228, 205, 136/230

(56) References Cited

U.S. PATENT DOCUMENTS

| | | | | |
|---|---|---|---|---|
| 1,823,706 A | * | 9/1931 | Staehle ...................... | 136/228 |
| 2,304,211 A | * | 12/1942 | Sparrow ..................... | 136/228 |
| 2,691,056 A | * | 10/1954 | Wolff ......................... | 136/228 |
| 2,946,835 A | * | 7/1960 | Westbrook et al. ......... | 136/228 |
| 2,972,654 A | * | 2/1961 | Fritts et al. ................. | 136/228 |
| 3,007,989 A | * | 11/1961 | Nicholson et al. .......... | 136/228 |
| 3,038,950 A | * | 6/1962 | Hajny ........................ | 136/228 |
| 3,343,589 A | * | 9/1967 | Holzl ......................... | 136/228 |
| 3,929,511 A | * | 12/1975 | Solomon .................... | 136/228 |
| 3,973,997 A | * | 8/1976 | Solomon .................... | 136/228 |
| 4,021,268 A | * | 5/1977 | Smith ......................... | 136/228 |
| 4,732,620 A | * | 3/1988 | Hunold et al. .............. | 136/228 |
| 5,696,348 A | * | 12/1997 | Kawamura et al. ......... | 136/228 |

FOREIGN PATENT DOCUMENTS

| | | | | |
|---|---|---|---|---|
| FR | 1145419 | * | 1/1956 | ................. 136/228 |

* cited by examiner

Primary Examiner—B Mullins
(74) Attorney, Agent, or Firm—Frank J Catalano

(57) ABSTRACT

A millivoltage generator is provided in which a rod formed of a first metal extends in spaced relationship within a tubular sheath of a second metal, the rod being welded to the sheath at one end to form a conductive junction and held in place in the sheath by an epoxy seal proximate the other end of the rod which prevents moisture from collecting inside the sheath. The space between the sheath and the rod is filled with an insulating material. Preferably, a wire connector is fixed to the end of the rod which extends through and beyond the epoxy seal. It is also preferred that a bushing be welded to the outside of the sheath proximate the epoxy seal and that the bushing be externally threaded to facilitate mounting of the millivoltage generator. A second metal rod welded to the bushing extends from the bushing parallel to the first metal rod and beyond the epoxy seal. Another wire connector is fixed to the second metal rod to facilitate electrical connection of the millivoltage generator.

7 Claims, 1 Drawing Sheet

US 6,846,983 B1

MILLIVOLTAGE GENERATOR

BACKGROUND OF THE INVENTION

This invention relates generally to temperature sensing devices and more particularly concerns temperature sensing devices usable for thermal switching.

A typical thermocouple is illustrated in FIG. 1. It consists of a positive thermocouple wire 11 connected to a negative thermocouple wire 13 at a measuring junction 15. The wires 11 and 13 are of dissimilar metals so that current will flow through the wires 11 and 13 when the junction 15 is heated. The voltage across the wires is a function of the composition of the two wires 11 and 13 and the temperature applied to the junction 15. This is generally known as the Seebeck effect and the voltage across the two wires referred to as the Seebeck voltage in reference to Thomas Seebeck who discovered the phenomena in 1821. Thermocouples for measuring the Seebeck voltage, such as the thermocouple illustrated in FIG. 1, might typically employ a copper positive wire 11 and a constantan negative wire 13 separated within an insulation material 17 such as magnesium oxide, all encased within a protective sheath 19.

There are several problems inherent in the type of thermocouple above described. The positive and negative wires 11 and 13 of known thermocouples are generally quite fragile, typically of sixteen gauge wire or finer, and consequently have a limited life in most applications. A life of approximately one year is quite common. The cost of manufacture of known thermocouples is increased due to the need for an internal weld at the measuring junction 15. While these problems may have been unavoidable in thermocouples used in temperature transducer applications where a linear relationship between the junction temperature and the Seebeck voltage is required, there are many switching applications for which such linearity is unnecessary. However, thermocouples such as that hereinbefore described are presently used for both transducer and thermal switching applications.

It is, therefore, a primary object of this invention to provide a millivoltage generator employing the Seebeck effect usable in thermal switching applications. It is further an object of this invention to provide a millivoltage generator having a greater life expectancy than known thermocouples. Another object of this invention is to provide a millivoltage generator which requires no internal weld. It is also an object of this invention to provide a millivoltage generator which is less expensive than known thermocouples. And, it is an object of this invention to provide a millivoltage generator in which the generator sheath replaces one of the wires used in known thermocouples.

SUMMARY OF THE INVENTION

In accordance with the invention, a millivoltage generator is provided in which a rod formed of a first metal extends in spaced relationship within a tubular sheath of a second metal, the rod being welded to the sheath at one end to form a conductive junction and held in place in the sheath by an epoxy seal proximate the other end of the rod which prevents moisture from collecting in the sheath. The space between the sheath and the rod is filled with an insulating material. Preferably, a wire connector is fixed to the end of the rod which extends through and beyond the epoxy seal to facilitate electrical connection of the millivoltage generator. Preferably, a bushing is welded to the outside of the sheath proximate the epoxy seal and the bushing is externally threaded to facilitate mounting of a head to cover and protect the connections of the millivoltage generator. A second metal rod welded to the bushing extends from the bushing parallel to the first metal rod and beyond the epoxy seal. Another wire connector is fixed to the second metal rod to facilitate electrical connection of the millivoltage generator.

BRIEF DESCRIPTION OF THE DRAWINGS

Other objects and advantages of the invention will become apparent upon reading the following detailed description and upon reference to the drawings in which.

While the invention will be described in connection with a preferred embodiment, it will be understood that it is not intended to limit the invention to that embodiment. On the contrary, it is intended to cover all alternatives, modifications and equivalents as may be included within the spirit and scope of the invention as defined by the appended claims.

DETAILED DESCRIPTION OF THE INVENTION

Figure 1:
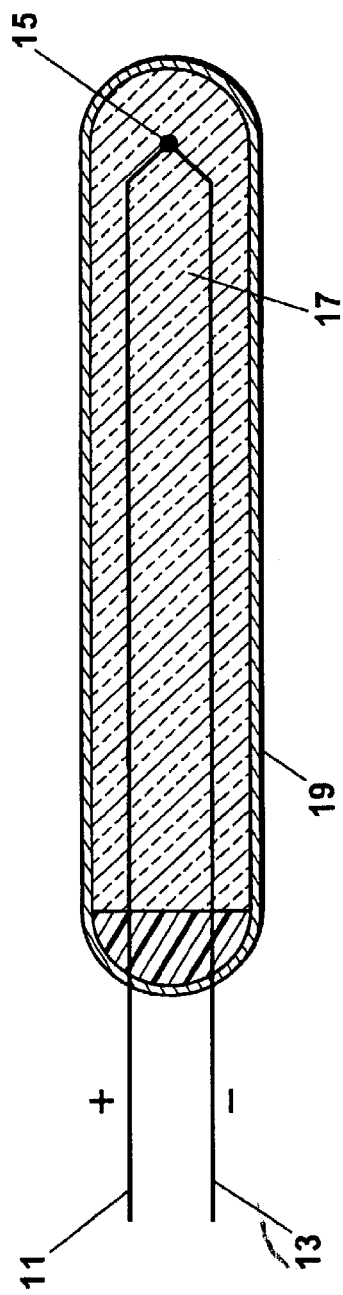
FIG. 1 is a cross-sectional view illustrating a typical prior art thermocouple.
Figure 2:
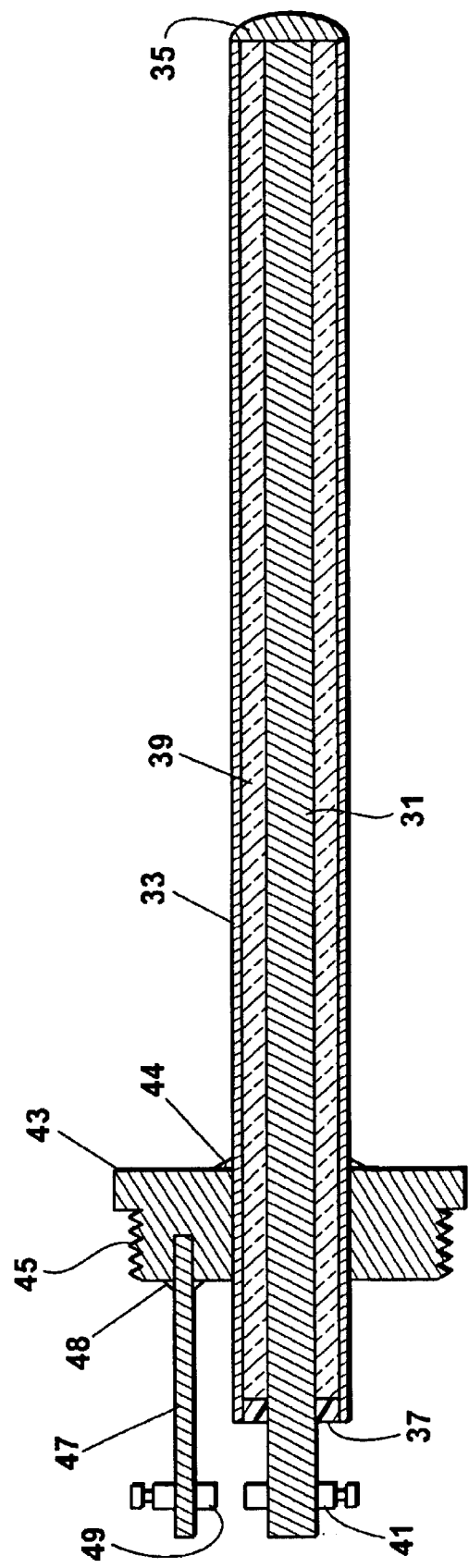
FIG. 2 is a cross-sectional view illustrating a preferred embodiment of the millivoltage generator in accordance with the present invention.

Looking at FIG. 2, a millivoltage generator in accordance with the present invention includes a rod 31 of a first metal such as constantan or other suitable thermocouple material extending in spaced apart relationship within a tubular and preferably cylindrical sheath 33 of a second metal such as iron or stainless steel or other suitable thermocouple material. The rod 31 is fixed, preferably by a weld 35, to the sheath 33 at one of its ends to form a conductive junction and is held in place in the sheath 33 by an epoxy seal 37 at the other end of the sheath 33 which seals the interior of the generator to prevent absorption of moisture within the sheath 33. The rod 31 extends through and beyond the epoxy seal 37 to a point external of the sheath 33. An insulator 39, such as magnesium oxide, fills the space between the metal rod 31 and the metal sheath 33. A wire connector 41 is mounted on the end of the rod 31 proximate the epoxy seal 37 to facilitate electrical connection of the millivoltage generator. A bushing 43, preferably, but not necessarily of the same metal as the sheath 33, is fixed to the outer surface of the sheath 33 proximate the epoxy seal 37, preferably by a weld 44. The bushing 43 is provided with an external thread 45 to facilitate structural mounting of a head (not shown) to protect the connections of the millivolt generator. A second metal rod 47, preferably, but not necessarily, of the same metal used to form the bushing 45 and the sheath 33, is fixed, preferably by a weld 48, to the bushing 45. The second metal rod 47 extends parallel to the first metal rod 31 and beyond the epoxy seal 37 of the sheath 33. Another wire connector 49 fixed to the free end of the second metal rod 47 facilitates electrical connection of the millivoltage generator.

In operation, a Seebeck voltage will be generated across the rod 31 and the sheath 33 which will correspond to the temperature at the junction 35. The temperature/voltage relationship will generally not be linear, but a distinct voltage within reasonable tolerance will result for a selected temperature. The voltage can then be employed as a switching voltage in any desired application.

It has been found that, by using the structural configuration above described with a rod 31 of eight gauge wire, a millivoltage generator usable with a thermal switch is provided which has a life in a range of five years, or approximately five times that of known thermocouples used in the same type of switching operations.

While the invention has been described in relation to suggested materials for use as the rod 31, the sheath 33, the insulation 39, the bushing 45 and the second metal rod 47, many other materials will be recognized by those of ordinary skill in the art to be applicable to the teachings of the present invention. It is necessary only that, for a given choice of materials, the Seebeck voltage produced by the millivoltage generator at the desired switching temperature be within a minimum range of tolerance suitable to a given application.

Thus, it is apparent that there has been provided, in accordance with the invention, a millivoltage generator that fully satisfies the objects, aims and advantages set forth above. While the invention has been described in conjunction with specific embodiments thereof, it is evident that many alternatives, modifications and variations will be apparent to those skilled in the art and in light of the foregoing description. Accordingly, it is intended to embrace all such alternatives, modifications and variations as fall within the spirit of the appended claims.

What is claimed is:

1. A millivoltage generator comprising a rod of a first metal having side walls extending within and spaced apart from the interior side walls of a tubular sheath of a second metal, said rod having an end face thereof fixed against an inner face of a closed end of said sheath, said rod side walls and said sheath interior side walls having no abutting contact with each other, said rod extending beyond an open end of said sheath to a second end thereof, said rod being held in place in said sheath proximate said second end thereof, and a first wire connector fixed to said second end of said rod external to said sheath to facilitate electrical connection of said millivoltage generator.

2. A millivoltage generator comprising a rod of a first metal having side walls extending within and spaced apart from the interior side walls of a tubular sheath of a second metal, said rod having an end face thereof fixed against an inner face of a closed end of said sheath, said rod side walls and said sheath interior side walls having no abutting contact with each other, said rod extending beyond an open end of said sheath to a second end thereof, said rod being held in place in said sheath proximate said second end thereof, and a bushing fixed to an outer surface of said sheath proximate said open end thereof.

3. A millivoltage generator according to claim 2, said bushing having an external thread for structurally mounting a head on said millivoltage generator.

4. A millivoltage generator according to claim 3, said bushing being of the same metal as said sheath.

5. A millivoltage generator according to claim 3 further comprising a second rod fixed to said bushing and extending from said bushing parallel to said first rod and past said open end of said sheath.

6. A millivoltage generator according to claim 5, said bushing and said second rod being of the same metal as said sheath.

7. A millivoltage generator according to clam 5, further comprising a second wire connector fixed to a free end of said second rod to facilitate electrical connection of said millivoltage generator.

* * * * *